United States Patent [19]
Klein et al.

[11] Patent Number: 6,051,881
[45] Date of Patent: Apr. 18, 2000

[54] FORMING LOCAL INTERCONNECTS IN INTEGRATED CIRCUITS

[75] Inventors: Richard K. Klein, Mountain View; Asim A. Selcuk, Cupertino; Nicholas J. Kepler, San Jose; Craig S. Sander, Mountain View; Christopher A. Spence; Raymond T. Lee, both of Sunnyvale; John C. Holst, San Jose, all of Calif.; Stephen C. Horne, Austin, Tex.

[73] Assignee: Advanced Micro Devices, Sunnyvale, Calif.

[21] Appl. No.: 08/986,097

[22] Filed: Dec. 5, 1997

[51] Int. Cl.[7] .......................... H01L 23/48; H01L 23/52; H01L 29/40

[52] U.S. Cl. ........................ 257/756; 257/380; 257/379

[58] Field of Search ............................ 257/380, 379, 257/756, 767, 640, 649, 758, 192; 438/634, 190, 233, 210, 180

[56] References Cited

U.S. PATENT DOCUMENTS

| | | | |
|---|---|---|---|
| 5,246,882 | 9/1993 | Hartmann | 437/195 |
| 5,291,058 | 3/1994 | Samata et al. | 257/641 |
| 5,320,975 | 6/1994 | Cederbaum et al. | 437/44 |
| 5,385,857 | 1/1995 | Solo De Zaldivar | 437/44 |
| 5,479,054 | 12/1995 | Tottori | 257/752 |
| 5,482,894 | 1/1996 | Havemann | 437/195 |
| 5,663,086 | 9/1997 | Rostoker et al. | 438/210 |

*Primary Examiner*—Olik Chaudhuri
*Assistant Examiner*—Phat X. Cao
*Attorney, Agent, or Firm*—Foley & Lardner

[57] ABSTRACT

A method and the resulting device to permit the formation of minimal insulating space between polysilicon gates by forming an insulating layer over the polysilicon gates and protecting selected ones of the gates and the insulating layer with an etch barrier so that the opening for local interconnect metallization can be misaligned and the selected gates will be protected by its etch barrier and not be exposed to the opening. Further, local interconnect conductive material can pass over a gate or unrelated resistor without shorting the gate/resistor.

9 Claims, 5 Drawing Sheets

FIG. 1g  PRIOR ART COMPARISON
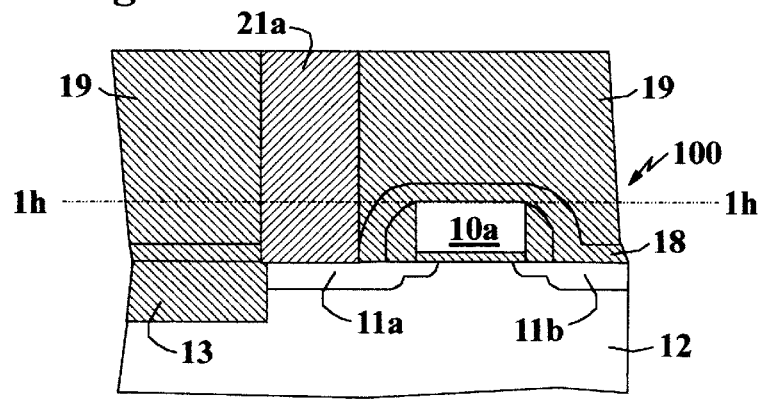
FIG. 1h  PRIOR ART COMPARISON
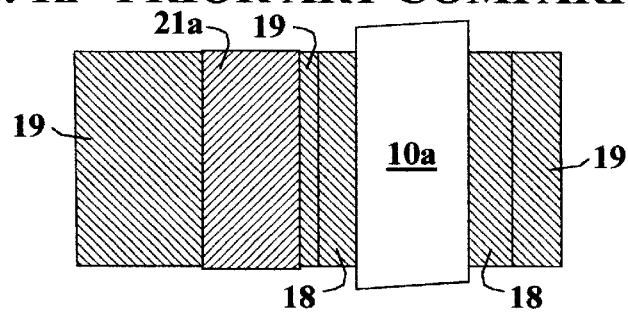
FIG. 2l  COMPARISON
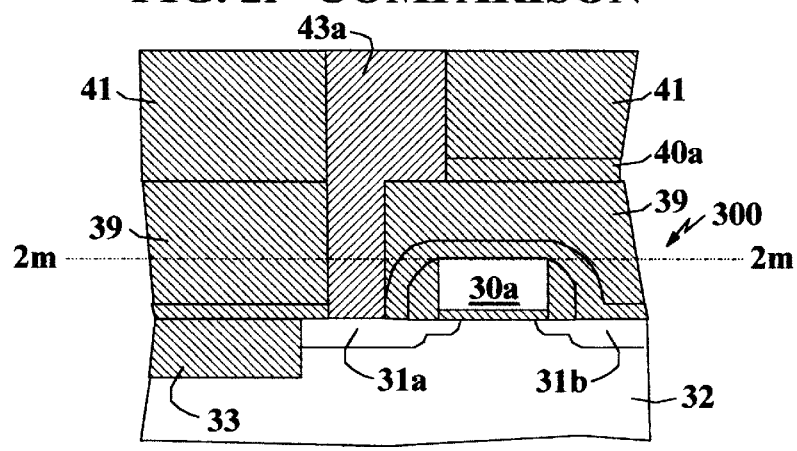
FIG. 2m  COMPARISON
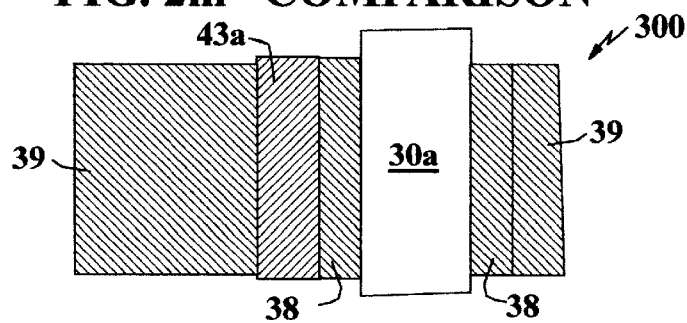

FORMING LOCAL INTERCONNECTS IN INTEGRATED CIRCUITS

FIELD OF THE INVENTION

The present invention relates to fabricating integrated circuits and, more specifically, to fabricating local interconnects in integrated circuits with minimal insulating spacing between adjacent gates of field effect transistors and/or adjacent resistors, and the resultant structure.

BACKGROUND OF THE INVENTION

With the demand for higher levels of integration of semiconductor chips, such as silicon semiconductor chips, and the need for greater density in these circuits, the spacing between the gates of field effect transistors (FET) in forming local interconnects to the source and drain of the FET becomes more and more critical. This is specially the case with a microprocessor integrated circuit chip of which a large portion of the real estate of the chip is an SRAM. For increased performance of future microprocessor, the storage capacity of the SRAM must increase thereby requiring a larger portion of real estate of the microprocessor.

The use of local interconnect (LI), in particular with the damascene method, greatly enhances packing density since it generally has much tighter pitch than other global interconnect methods such as aluminum metallization. Further, damascene and other similar LI methods result in smaller transistor size by eliminating the tolerance space commonly used to prevent source/drain contacts from misaligning onto the field oxide regions. However, tolerance space between gates and/or resistors is still required and must be larger than the misalignment error of the lithographic tools used in forming the LI. If this tolerance space can be reduced or all together eliminated without shorting of the local interconnect opening to adjacent unrelated polysilicon gates or resistors, the packing efficiency can be further enhanced. One shortcoming of the damascene local interconnect method is its inability to route over unrelated conductors, such as a transistor gate, or unrelated resistors. A method that enables such capability will further enhance packing density.

SUMMARY OF THE INVENTION

Accordingly, it is an object of the present invention to provide a method of fabricating an integrated circuit with local interconnects, preferably damascene, so that the layout of the local interconnects contain minimum space to an adjacent unrelated polysilicon gate or resistor.

Another object of present invention is to provide an integrated circuit fabrication method in which the local interconnect, preferably damascene, can cross over selected gates and function similar to global interconnections.

An additional object of the present invention is to provide an integrated circuit fabrication method which provides flexibility in design layout and permits a trade off relative to contact area and space between gates so as to reduce the size of the transistor.

In accordance with the present invention, an integrated circuit semiconductor substrate is fabricated using selective etch stopping barriers in forming the local interconnects so that minimum source and drain widths can be used for all transistors. The fabrication method comprises the steps of: forming at least two gates of a field effect transistor with a space between the gates; forming a first insulating layer over the gates of a thickness to prevent unintentional shorting of the gates by local interconnection conductive material; forming an etch barrier layer on said first insulating layer having an etch selectivity different from the first insulating layer; forming a pattern for covering selected ones of the gates and, alternatively, and unrelated resistor with the etch barrier layer and removing the patterned etch barrier layer; forming a second insulating layer on said unremoved etch barrier layers and having said etch barrier layers disposed between the first and second insulating layers; forming a pattern for local interconnect openings; removing the second insulating layer corresponding to the interconnect pattern along with the first insulating layer not covered by an etch barrier layer; and filling the local interconnect openings with conductive material.

The novel integrated circuit semiconductor device of the present invention resulting from the above method comprises: a semiconductor substrate having adjacent field effect transistors, each having a source a drain and a gate; a first layer of insulating material over and between said gates; etch barriers on said first insulating layer and, each of the barriers aligned with one of said gates; a second insulating layer disposed on the first insulating layer with the barrier layers being between the first and second layers; and conductive material extending through the first and second insulting layers to the source and drains, said conductive material being prevented from extending through the first insulating layer below the etch barrier layers. Alternatively, an unrelated resistor can be disposed between the two transistors and an etch barrier layer leaves the first insulating layer over the resistor contact so that no conductive material can contact the resistor.

Preferably, an etch stopping layer is formed over said gates and between the polysilicon gates and/or resistor. The portion of the etch stopping layer in the local interconnect openings is removed prior to filling the openings with conductive material. In addition, an unrelated resistor may be disposed between the transistors.

BRIEF DESCRIPTION OF THE DRAWINGS

The foregoing and other objects, aspects and advantages will be better understood from the following detailed description of a preferred embodiments of the invention with reference in the drawings, in which:

FIG. 1g is a cross-sectional view of a portion of the prior art semiconductor substrate with a single transistor for comparison purposes with the present invention.

FIG. 1h is a plan view of the single transistor of FIG. 1g taken along line 1h—1h of FIG. 1g for comparison purposes with the present invention.

FIG. 2l is a cross-sectional view of a portion of the semiconductor substrate with a single transistor for comparison purposes with the prior art.

FIG. 2m is a plan view of the single transistor of FIG. 2l taken along line 2m—2m of FIG. 2l for comparison purposes with the prior art.

DETAILED DESCRIPTION OF THE PREFERRED EMBODIMENTS OF THE INVENTION

Figure 1A:
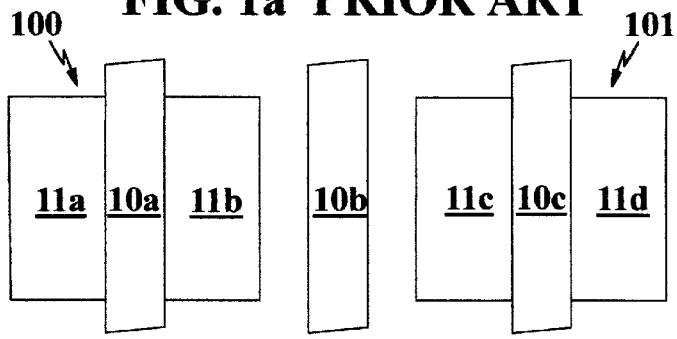
FIG. 1a is a plan view of a portion of a prior art semiconductor substrate with two adjacent MOS field effect transistors with an unrelated polysilicon resistor in between and with minimum allowable widths for the prior art method.
Figure 1B:
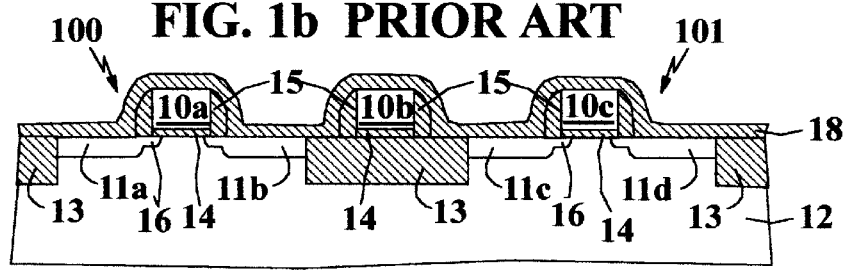
FIG. 1b is a cross-sectional view of the portion of a prior art semiconductor substrate with the two MOS field effect transistors and resistor of FIG. 1a with a conformal insulating etch stopping layer thereon.
Figure 1C:
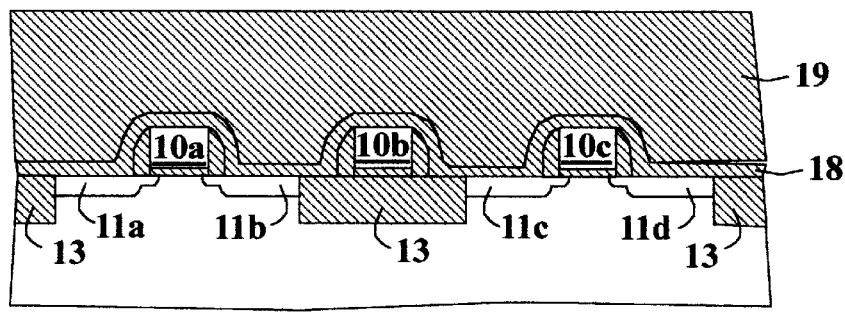
FIG. 1c is a cross-sectional view of the portion of the prior art semiconductor substrate with the two transistors and resistor of FIG. 1b covered with an insulating layer.
Figure 1D:
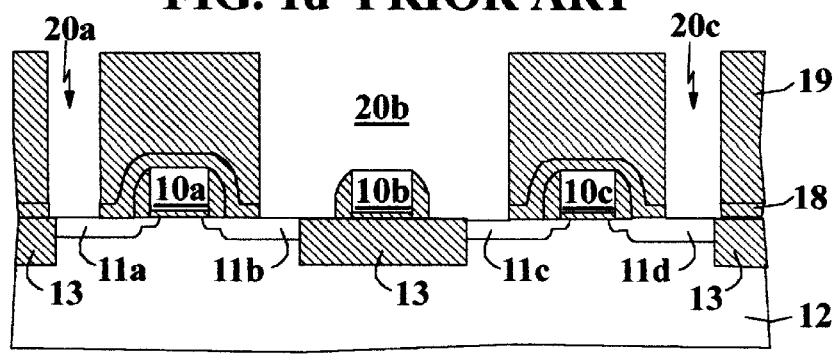
FIG. 1d is a cross-sectional view of the portion of the prior art semiconductor substrate with local interconnect openings formed in the insulating layer and the conformal etch stopping layer of FIG. 1c.
Figure 1E:
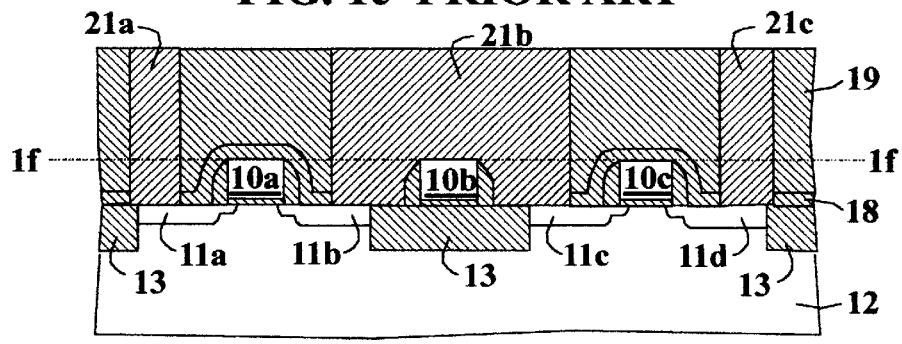
FIG. 1e is a cross-sectional view of the portion of the prior art semiconductor substrate with the local interconnect openings of FIG. 1d filled with conductive material.
Figure 1F:
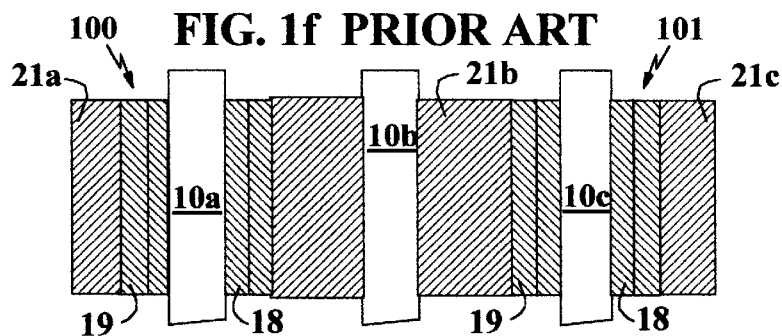
FIG. 1f is a plan view of the portion of the prior art semiconductor substrate of FIG. 1e taken along line 1f—1f of FIG. 1e showing the pattern of the conductive material.

Referring now to the drawings and starting with the prior art method of FIGS. 1a–1f, FIG. 1a shows a plan view of MOS transistor 100 comprising a polysilicon gate 10a and active regions 11a and 11b (or source and drain regions of MOS transistor 100) and MOS transistor 101 with polysilicon gate 10c and active regions 11c and 11d (or source and drain regions of MOS transistor 101). An unrelated polysilicon resistor 10b is positioned between the two transistors 100 and 101. To illustrate the steps of forming local interconnects, FIGS. 1b to 1d show cross-sectional views aligned with the plan view of FIG. 1a and illustrate the use of local interconnects to link the active regions 11b and 11c with the other active regions using minimum widths as allowed by the prior art method. As shown in FIG. 1b, active regions 11a, 11b, 11c and 11d are formed in a semiconductor substrate 12 and isolated by field oxide trenches 13. Polysilicon gates 10a and 10c and polysilicon resistor 10b are patterned and disposed on gate oxide 14. Insulating spacers 15 are formed on the walls of the polysilicon gates 10a and 10c and the polysilicon resistor 10b after the implantation of lightly doped drains (LDDs) 16 for the transistors and before the implantation of the remainder of the sources and drains 11a, 11b, 11c and 11d for the transistors. After both implantations, the semiconductor is annealed. A conformal etch stopping layer 18 of insulating material, herein silicon nitride (SiN) from a source of silane ($SiH_4$) and nitrogen ($N_2$) or ammonia ($NH_3$), or alternatively silicon oxynitride ($SiO_xN_y$), is deposited on the top of the polysilicon gates 10a and 10c, the polysilicon resistor 10b, the spacers 15, the active regions 11a, 11b, 11c and 11d, and the field oxide 13. As shown in FIG. 1c, a thick insulating layer 19 of silicon oxide material is deposited from a source of silane ($SiH_4$) and oxygen ($O_2$), or alternatively tetraethylorthosilicate (TEOS). After the layer 19 is planarized by chemical/mechanical polishing (CMP), a resist pattern (not shown) for the local connect openings is formed on the layer 19 and the unmasked areas of the layer 19 and the underlying portions of the etch stopping layer 18 are removed by etching to form the local connect openings 20a, 20b, and 20c, as shown in FIG. 1d. The openings 20a, 20b, and 20c are filled, respectively, with a conductive material 21a, 21b and 21c, such as tungsten, to provide for interconnection from the source 11a, 11d and drain 11b, 11c of transistors 100 and 101, respectively, as shown in FIG. 1e to other parts of the integrated circuit of the semiconductor substrate. It is shown in FIG. 1e that, by connecting drains 11b and 11c with the conductive material 21b, both drains will be electrically connected to the unrelated polysilicon resistor 10b. FIG. 1f shows a plan view of the deposited conductive material.

Figure 2A:
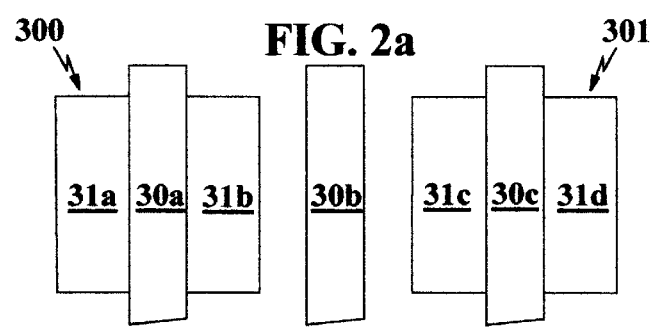
FIG. 2a is a plan view of the portion of the semiconductor substrate of the present invention with two MOS field effect transistors each with polysilicon gate and an unrelated polysilicon resistor in between and with the allowable widths being substantially less than the prior art method.
Figure 2B:
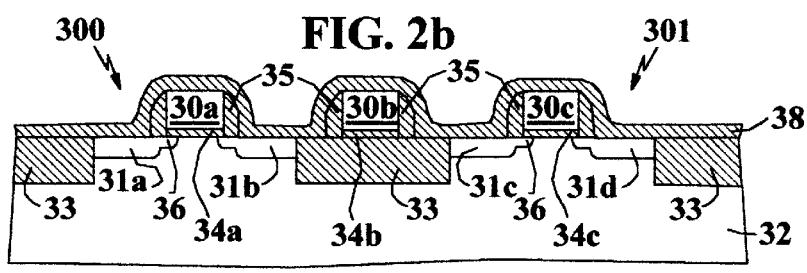
FIG. 2b is a cross-sectional view of the portion of the semiconductor substrate with the two MOS transistors and resistor of FIG. 2a with a conformal insulating etch stopping layer.

Now, turning to the method of present invention to be described in conjunction with FIGS. 2a–2k, FIG. 2a shows a plan view of MOS transistor 300 comprising a polysilicon gate 30a and active regions 31a and 31b (or source and drain regions of MOS transistor 300) and MOS transistor 301 with polysilicon gate 30c and active regions 31c and 31d (or source and drain regions of MOS transistor 301) in and on a semiconductor substrate 32. An unrelated polysilicon resistor 30b is positioned between the two transistors 300 and 301. The polysilicon gates 30a and 30c and polysilicon resistor 30b of FIG. 2a correspond in size and spacing to the polysilicon gates and polysilicon resistor of the FIG. 2b which shows the gates 30a and 30c in cross-section on gate oxide 34a and 34c. Oxide layer 34b is between substrate 32 and the resistor 30b. Sources and drain 31a–d are shown relative to gates 30a and 30c with lightly doped drain (LDD) portions as a result of sidewalls 35. The gates and underlying oxide layers are disposed on a portion of the semiconductor substrate 32, herein silicon, having a field oxide trench 33 formed in the silicon substrate. A conformal etch stopping layer 38 of insulating material, which herein is silicon nitride from a conformal source of silane ($SiH_4$) and ammonia ($NH_3$) or nitrogen ($N_2$), is chemically vapor deposited on the polysilicon gates 30a–c, the polysilicon resistor 30b, sidewalls 35, sources and drains 31a–d, and trenches 33 as shown in FIG. 2b.

Figure 2C:
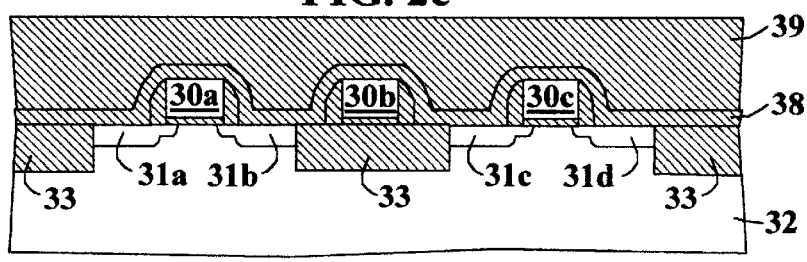
FIG. 2c is a cross-sectional view of the portion of the semiconductor substrate of FIG. 2b with a first insulating layer on the etch stopping layer.
Figure 2D:
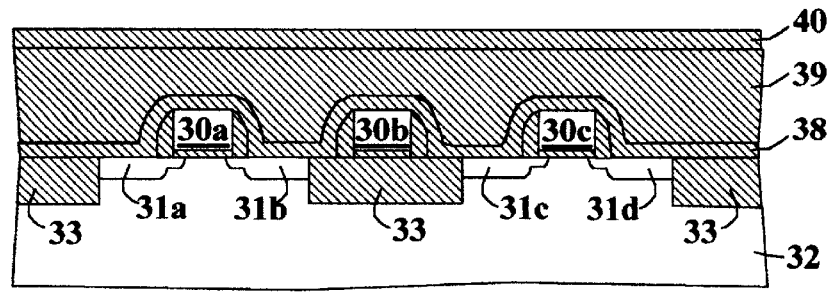
FIG. 2d is a cross-sectional view of the portion of the semiconductor substrate of FIG. 2c with an etch barrier on the first insulating layer.
Figure 2E:
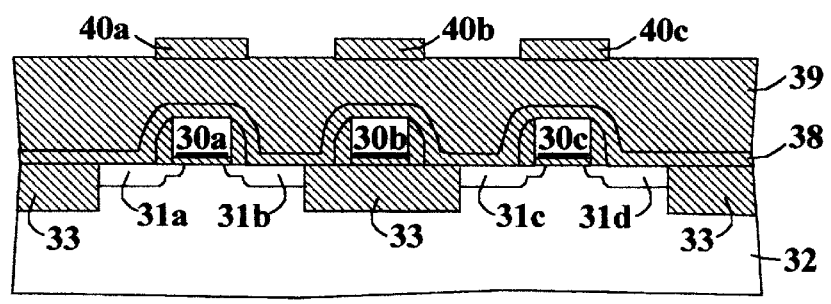
FIG. 2e is a cross-sectional view of the portion of the semiconductor substrate with of FIG. 2d with the etch barrier partially removed but remaining over selected polysilicon areas.
Figure 2F:
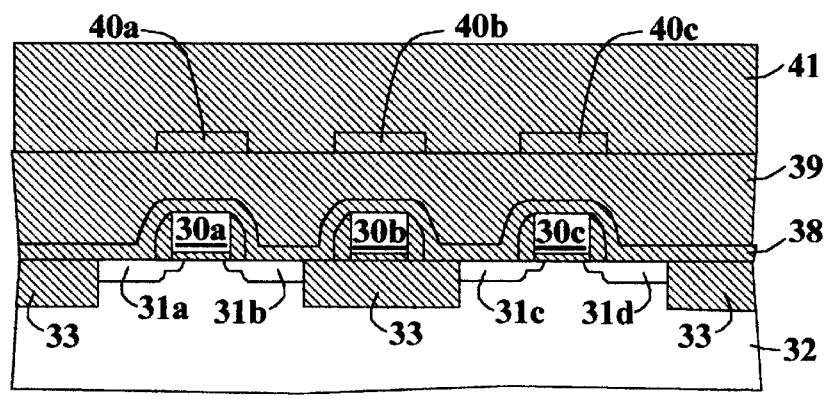
FIG. 2f is a cross-sectional view of the portion of the semiconductor substrate of FIG. 2e with a second insulating layer on the first insulating layer and the remaining etch barriers.
Figure 2G:
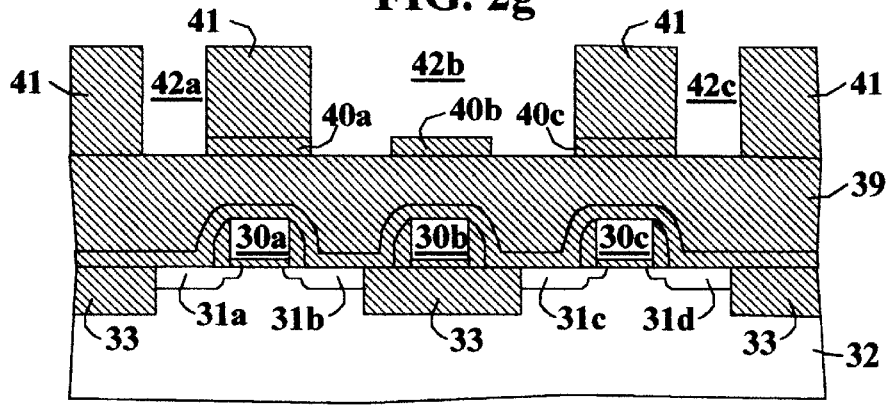
FIG. 2g is a cross-sectional view of the portion of the semiconductor substrate of FIG. 2f with local interconnect openings formed in the second insulating layers.
Figure 2H:
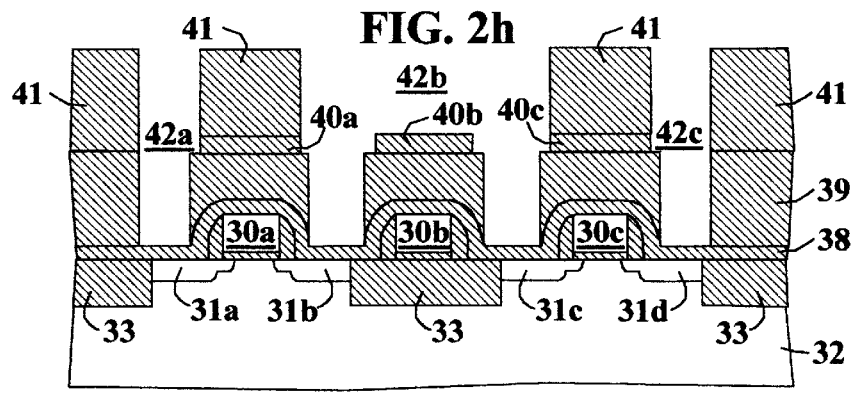
FIG. 2h is a cross-sectional view of the portion of the semiconductor substrate of FIG. 2g with local interconnect openings formed in the first insulating layer.
Figure 2I:
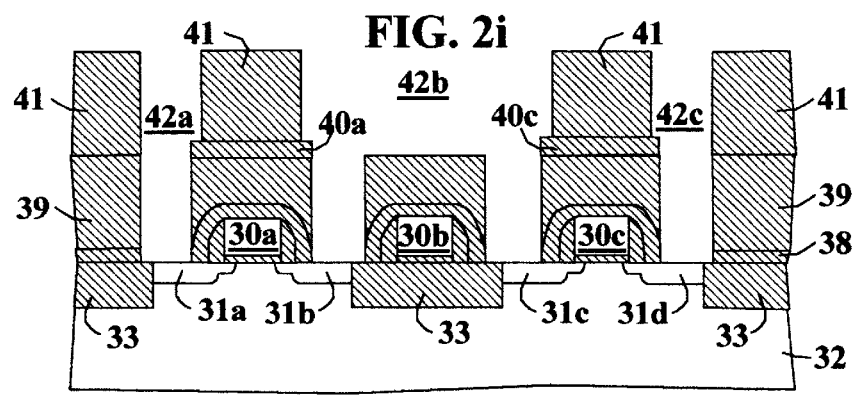
FIG. 2i is a cross-sectional view of the portion of the semiconductor substrate of FIG. 2h with the etch barrier over the resistor removed along with the portions of the etch stopping layer in the local interconnect openings.

In accordance with the present invention, a first insulating layer 39, which, herein is silicon oxide from a source of tetraethylorthosilicate (TEOS) and oxygen ($O_2$), is chemically vapor deposited on the surface of the etch stopping layer 38 and is planarized by chemical mechanical polishing (CMP) as shown in FIG. 2c. This is followed an etch barrier layer 40, herein silicon nitride ($Si_3N_4$ or SiN), which is chemically vapor deposited on the planarized silicon oxide layer 39 using silane and ammonia or nitrogen gas, as shown in FIG. 2d. Another insulating material for the barrier layer is silicon oxynitride ($SiO_xN_y$). The silicon nitride etch barrier 40 is patterned with a photolithographic resist (not shown) to mask the polysilicon areas, herein gates 30a and 30c and resistor 30b, as shown in FIG. 2e. The etch barrier layer 40 preferably is anisotropically etched using a plasma gas which is more selective for silicon nitride than silicon oxide so that the silicon oxide layer 39 is not etched during removal of the portions of the etch barrier layer 40 not masked by photoresist. Next, a thick second insulating layer 41 of herein silicon oxide from a source of silane or TEOS and oxygen is deposited as shown in FIG. 2f to create selective etch barriers 40a, 40b and 40c in the insulating layer 41. The small step which was created during the etching of layer 40 optionally can be removed by another quick CMP planarization, after which a photolithographic resist pattern (not shown) for the local connect openings is formed on the layer 41. The areas of the layer 41, which are not masked by the resist pattern, are removed by etching to partially form the local interconnect openings 42a, 42b and 42c in the second insulating layer 41, as shown in FIG. 2g. Preferably, the first insulating layer 39 is the same insulating material as the second insulating layer 41 and has the same selectivity. Accordingly, the etching of the local interconnect openings 42a, 42b and 42c continues to stop at the etch stopping layer 38 as shown in FIG. 2h. The etch stopping layer 38 remaining in the openings 42a, 42b and 42c along with barrier layer 40b, if desired, is removed by anisotropically etching with a plasma gas more selective for silicon nitride than oxides of silicon, as shown in FIG. 2i. Now, the openings 42a, 42b and 42c are filled with a conductive material 43a, 43b and 43c, respectively, as shown in cross-section in FIG. 2j and in plan view in FIG. 2k. The openings 42a and 42c with conductive material 43a and 43c provide for interconnection from the source regions 31a, 31d of transistors 300 and 301 to other parts of the integrated circuit. Opening 42b with conductive material 43b connected the two drains 31b and 31c of transistors 300 and 301 together. Unlike the prior art, the drains 31b and 31c are not connected to the unrelated polysilicon resistor 30b. In the present instance, the conductive material 43a and 43b is tungsten.

In comparing the layout of FIG. 1a (Prior Art) and FIG. 2a (Present Invention), it is apparent that the source and drain widths are much reduced with the present invention relative to the prior art. The main reason that this is possible with the present invention is that the LI opening can encroach and even overlap with respect to the polysilicon gates without electrically shorting. To further illustrate this point, a portion of the layout of the transistor 100 and 300 for both the prior art method and the method of the present invention, respectively, are compared with a worst case misalignment occurring between LI and the gates; namely, source 11a and gate 10a, as shown in prior art FIGS. 1g and 1h and, for the present invention, as shown in FIGS. 2l and 2m, source 31a and gate 30a. In the prior art method, an extra space must be added between LI opening filled with conductive material 21a and gate 10a to prevent the two from overlapping under all processing conditions. This space must include contributions from imperfection in alignment of the two layers and any process biases of both LI and the polysilicon features. For example, long local interconnects openings will tend to balloon outward during the photolithographic step as a result of process optimization to make certain short LI openings are formed. With the present invention, this space can be substantially reduced because the local interconnect can overlap onto adjacent polysilicon gate without shorting as depicted in FIGS. 2l and 2m. For example, the upper portion of the conductive material 43a, as partially shown in dashed lines in the plan view of FIG. 2m, is prevented from contacting and shorting the gate 30a by the layer 39, shown in dashed lines, between the conductive material 43a and the gate 30a.

To supplement the above general description of the present invention, a detailed description of the steps of the present invention will now be given. The layout of the transistors 300 and 301, herein for N-type transistors, are substantially compact as shown by contrasting FIG. 2a of the present invention with FIG. 1a of the prior art. Except for the narrower source and drain widths, the initial steps necessary to fabricate the structure of FIG. 2a are those of the prior art method in which a field oxide 33 is formed in a silicon substrate 32. Herein, gate oxides 34a, 34c and oxide layer 34b are thermal grown on and in the silicon substrate to a thickness in the range of 40 Å to 100 Å, followed by forming corresponding polysilicon gates 30a, 30c and resistor 30b, each of whose width is about 0.4 $\mu$m and thickness is about 2500 Å and which will be doped with an impurity, such as arsenic, to lower its resistivity. Preferably, gates 30a and 30c and resistor 30b will be implanted with the impurity at the same time the source and drain are implanted. Sidewalls 35, which are silicon oxide but also may be silicon nitride, are formed on the walls of the polysilicon gates from a conformal source of silicon, such as silane and either oxygen or ammonia gas. Prior to forming the sidewalls 35, the LDD portion of the sources and drains 31a–d are created by implanting phosphorus or arsenic. After forming the sidewalls 35, the remainder of the sources and drains 31a–d is completed by implanting arsenic. Prior to depositing the conformal insulating layer 38, herein silicon nitride from a TEOS source and ammonia, metal silicides (not shown), such as tungsten or titanium, can be created at the surfaces of polysilicon gates 30a, 30c and polysilicon resistor 30b and sources and drains 31a–d not covered by spacers or sidewalls 35. The silicon nitride layer 38 ranges in thickness from about 500 to 1000 Å.

Now in accordance with the present invention, a first insulating layer, herein silicon oxide from TEOS and oxygen, is chemically vapor deposited on the layer 38 followed by CMP process to form a planar insulating layer 39 with a thickness of about 2000 Å or at least sufficiently thick to prevent shorting between a polysilicon gates 30a, 30c and resistor 30b, and subsequent local interconnect conductive material. The insulating material also may be tetramethylcyclosilonane (TMCTS). This is followed by chemically vapor depositing a etch barrier layer 40 on the layer 39 similar in etch properties to the layer 38 and different in etch properties from the layer 39. Preferably, layer 40 is silicon nitride from a source of silane and ammonia, but also may be silicon oxynitride and ranges in thickness from about 500 to 1000 Å. FIG. 2d shows this layered structure.

A photolithographic commercially available resist (not shown) is coated on the etch barrier layer 40 preferably by spin coating. The resist is patterned by exposure and development to mask the layer 40 over selected ones of the polysilicon gates. The unmasked portions of the layer 40 are removed, preferably by anisotropic etching using a parallel plate plasma reactor and an etchant gas mixture of $C_4F_8$/ $CH_3F/O_2$, which is more selective for silicon nitride than silicon oxide, leaving etch barriers 40*a*, 40*b* and 40*c* as shown in FIG. 2*e*. It will be noted in FIG. 2*e* that the polysilicon gates 30*a* and 30*c* and resistor 30*b* are separated from the etch barriers 40*a*, 40*b* and 40*c*, respectively, by layers 38 and 39. A thick blanket insulating layer 41 of herein silicon oxide is chemical vapor deposition on the layer 39 and the layers 40*a*, 40*b* and 40*c* to leave the etch barriers 40*a*, 40*b* and 40*c* between layers 39 and 41 as shown in FIG. 2*f*. This silicon oxide layer is formed using silane ($SH_4$) or TEOS and oxygen, and an optional chemical/mechanical polishing with a commercially available slurry can be used to planarize the small step formed during the fabrication of the barriers 40*a–c*.

Figure 2J:
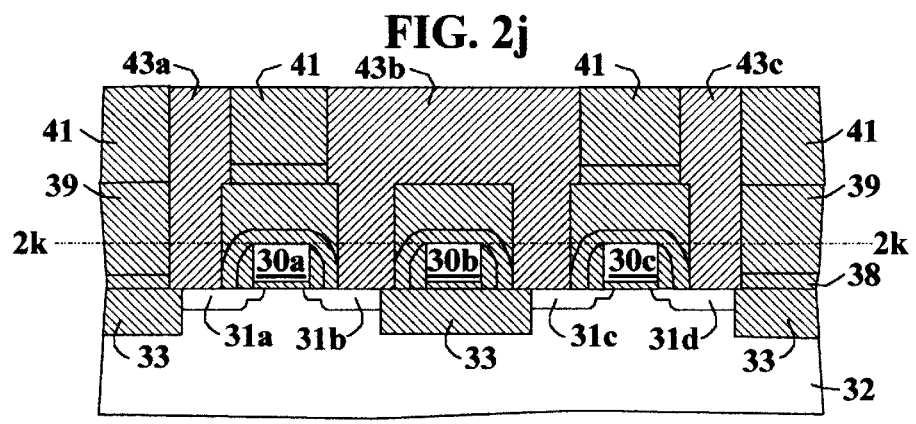
FIG. 2j is a cross-sectional view of the portion of the conductive line pattern of FIG. 2i with the local interconnect openings filled with a conductive material.
Figure 2K:
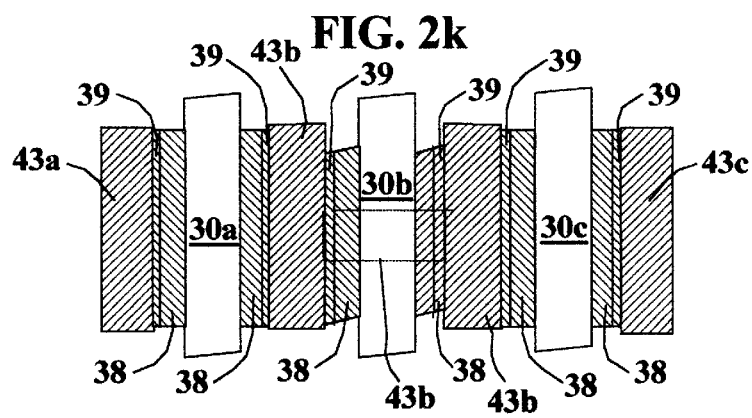
FIG. 2k is a plan view of the portion of the semiconductor substrate of FIG. 2j taken alone line 2k—2k of FIG. 2j.

Next, a photolithographic resist pattern (not shown) is spin coated, exposed and developed on layer 41 with openings in the resist pattern where the local connects are to made to the source and drains of transistors 300 and 301. Because of the etch barriers over the selected gates, the alignment of the photolithographic resist pattern for local connect is not a critical to prevent shorting of the local connect conductive material to the gates. Using the pattern (not shown) as a mask, the unmasked portions of layer 41 are removed as shown in FIG. 2*a*, preferably by anisotropic etching using a parallel plate plasma reactor and a gas which is more selective for silicon oxide than silicon nitride. Preferably, the insulating layer 39 is the same or similar material as the layer 41 and with the same etch selectivity so that layer 39 is etched after the openings are formed in layer 41, as shown in FIG. 2*h*. Herein carbon trifluoride ($CHF_3$) is used as the plasma gas for etching the silicon oxide of layers 39 and 41, followed by switching to carbon tetrafluoride ($CF_4$) and oxygen ($O_2$) for etching the silicon nitride etch stopping layer 38 to expose the sources/drains 31*a–d* at the surface of the silicon substrate 32 and thereby form the openings 42*a*, 42*b* and 42*c*, as shown in FIG. 2*i*. In etching the silicon nitride layer 38 with, herein, $C_4F_8/CH_3F/O_2$ to expose these surface for the local interconnect metallization, the silicon nitride barrier 40*b*, which is not masked by the resist pattern and has the same etch selectivity as layer 38, is etched away during the etching of the layer 38, as shown in FIG. 2*i*. However, the silicon oxide insulating layer 39 under the silicon nitride layer 40*b* remains to isolate the subsequent local interconnect conductive material from the polysilicon resistor 30*b* as shown in FIGS. 2*j* and 2*k*. If desired, the etch selectivity of the etch stopping layer 38 and etch barrier layer 40 can be different so that barrier layer 40, such as 40*b*, would not be removed during the removal of the stopping layer 38. With the openings 42*a*, 42*b* and 42*c* formed, the local interconnect conductive material 43*a*, 43*b* and 43*c* is deposited in the openings, as shown in FIGS. 2*j* and 2*k*. Herein, the metal is tungsten and it is chemical vapor deposited from tungsten hexafluoride ($WF_6$) with hydrogen vapor ($H_2$) for reduction.

The advantages of the present invention can be seen in FIGS. 2*i–2j* in that the unrelated polysilicon resistor 30*b* is isolated from the local interconnect by the silicon oxide insulating layer 39 because it was protected during the etching of the silicon oxide layer 39 and 41 by barrier 40*b*. The insulating layer 39 permits the local interconnect to connect drain 31*b* of transistor 300 to drain 31*c* of transistor 301 while passing over but without shorting resistor 30*b*. In addition, the opening filled with conductive material 43*a* of FIGS. 2*l* and 2*m* depicts a misalignment of the resist pattern and the opening necessary for contacting the drain 34. Because of the etch barrier 40*a*, the initial opening 43*a*, which would have shorted the gate 30*a* if the prior art method were used, was reduced by the barrier 40*a* thereby preventing the shorting problem due to misalignment. Further, the a visual comparison of prior art FIGS. 1*g*, 1*h*, and FIGS. 2*l*, 2*m* of the present invention establishes the saving in semiconductor substrate real estate by using an additional insulating layer and by having selective etch barriers of the present invention between the two insulating layers. Accordingly, by the method and the resulting structure of the present invention, the density of integrated circuit on the semiconductor wafer can be substantially increased.

Although this invention has been described relative to specific materials, and apparatuses for depositing and etching these materials, it is not limited to the specific materials or apparatuses but only to their specific characteristics. Other materials and apparatus can be substituted for those described herein which will be well understood by those skilled in the microelectronics and semiconductor arts after appreciating the present invention.

Having thus described the invention, what is claimed is:

1. An integrated circuit semiconductor device comprising:

a semiconductor substrate having at least two field effect transistors, each having a gate with an underlying gate oxide layer, a source and a drain;

a first insulating layer disposed over and between said transistors and positioned away from and out of contact with the gate oxide layers, the sources and the drains of the transistors;

etch barriers disposed on said first insulating layer and one etch barrier aligned with each of the gates of the transistors;

a second insulating layer disposed on said first insulating layer and said etch barriers, with the etch barriers being between the first and second insulating layers;

a polysilicon resistor positioned in an area between said two transistors with an etch barrier disposed on said first insulating layer aligned with the polysilicon resistor and without the second insulating layer in said area; and conductive material for local interconnects extending through the first and second insulating layers to the source and drains with misaligned conductive material contacting said etch barriers.

2. The semiconductor device of claim 1 wherein local interconnect conductive material is disposed over said resistor but is separated from the resistor by the first insulating layer.

3. The semiconductor device of claim 1 wherein an etch stopping layer is disposed on said transistors and under said first insulating layer.

4. The semiconductor device of claim 3 wherein the etch stopping layer and etch barriers have the same etch selectivity.

5. The semiconductor device of claim 3 wherein the etch stopping layer and the etch barriers have different etch selectivity from each other and the first and second insulating layers.

6. The semiconductor device of claim 1 wherein the local interconnect conductive material overlaps the gates of the transistors without making physical contact with the gates.

7. The semiconductor device of claim 1 wherein said gates are polysilicon.

8. The semiconductor device of claim 7 wherein the gates have sidewall spacers and the source and drains include lightly doped drains.

9. The semiconductor device of claim 1 wherein said etch barrier is a nitride of silicon and first and second insulating layers are an oxide of silicon.

* * * * *